United States Patent
Gokhale

(10) Patent No.: US 12,273,043 B2
(45) Date of Patent: Apr. 8, 2025

(54) DETECTION OF AC INPUT DISCONNECTION IN AN AC-DC CONVERTER SECTION OF A POWER CONVERTER

(71) Applicant: ABB Schweiz AG, Baden (CH)

(72) Inventor: Kalyan P. Gokhale, New Berlin, WI (US)

(73) Assignee: ABB Schweiz AG, Baden (CH)

( * ) Notice: Subject to any disclaimer, the term of this patent is extended or adjusted under 35 U.S.C. 154(b) by 260 days.

(21) Appl. No.: 17/889,617

(22) Filed: Aug. 17, 2022

(65) Prior Publication Data

US 2024/0063725 A1 Feb. 22, 2024

(51) Int. Cl.
*H02M 5/458* (2006.01)
*H02M 1/32* (2007.01)
*H02M 7/02* (2006.01)

(52) U.S. Cl.
CPC ........... *H02M 5/4585* (2013.01); *H02M 1/32* (2013.01); *H02M 1/322* (2021.05); *H02M 7/02* (2013.01)

(58) Field of Classification Search
CPC .......... H02H 3/24; H02H 3/247; H02H 3/253; H02H 7/10; H02H 7/12; H02H 7/1203; H02H 7/1216; H02H 7/125; H02M 1/32; H02M 1/322
See application file for complete search history.

(56) References Cited

U.S. PATENT DOCUMENTS 6,009,008 A * 12/1999 Pelly ..................... H02M 7/125
363/125

| | | | |
|---|---|---|---|
| 2016/0359424 A1* | 12/2016 | Tran | H02M 1/12 |
| 2017/0272023 A1 | 9/2017 | Ahmed et al. | |
| 2017/0346325 A1* | 11/2017 | Ohtake | H02M 7/06 |
| 2017/0373630 A1* | 12/2017 | Figie | H02P 29/024 |
| 2020/0395866 A1* | 12/2020 | Gonthier | H03K 17/74 |
| 2024/0223071 A1* | 7/2024 | Hattori | G01R 31/52 |

FOREIGN PATENT DOCUMENTS

| | | | | | |
|---|---|---|---|---|---|
| EP | 3869213 A1 | * | 8/2021 | | G01R 31/54 |
| JP | 3-3698 A | | 1/1991 | | |
| JP | 2001-296324 A | | 10/2001 | | |
| JP | 3718597 B2 | * | 11/2005 | | |
| JP | 4687839 B2 | * | 5/2011 | | |

OTHER PUBLICATIONS

European Patent Office, Extended European Search Report in European Patent Application No. 23191706.3, 7 pp. (Feb. 6, 2024).

* cited by examiner

*Primary Examiner* — Gustavo A Rosario-Benitez

(74) *Attorney, Agent, or Firm* — Leydig, Voit & Mayer, Ltd.

(57) ABSTRACT

A detection circuit including a converter configured to convert a multiphase alternating current (AC) input into a direct current (DC) output, a plurality of sensing diodes, each sensing diode being separately electrically connected to one phase of the multiphase AC input, at least one node arranged downstream from the plurality of sensing diodes relative to the multiphase AC input, a power source configured to output a power source voltage to the at least one node and plurality of sensing diodes, and a mask time generator configured to determine a node voltage at the at least one node and determine whether the node voltage persists for a predetermined mask time period.

15 Claims, 13 Drawing Sheets

DETECTION OF AC INPUT DISCONNECTION IN AN AC-DC CONVERTER SECTION OF A POWER CONVERTER

FIELD

The present disclosure relates to systems and methods for detecting an AC input disconnection in an AC-DC converter section of a power converter.

BACKGROUND OF THE INVENTION

Conventional power conversion equipment, like frequency converters, are commonly used in a variety of applications in which electrical power must be converted from alternating current (AC) power at a fixed frequency and voltage, supplied by the power grid. For example, variable-frequency drives often must convert fixed frequency and voltage power supplied by the grid into variable frequency—variable voltage source in order to adjust for proper control of AC motors. In many instances, AC power is first converted to direct current (DC) power via an AC-DC converter, and then subsequently converted back to AC power via a DC-AC converter, thereby enabling voltage and frequency of the final AC power output via adjustment in the DC-AC converter.

However, conventional power converters, like frequency converters, can be prone to malfunction due to disconnection of one phase of a three phase or multiphase input, possibly due to a blown fuse in that particular phase or by accidental disconnection of a connection due to a wiring fault. It is important to detect such a disconnection of an input phase and take appropriate and pre-emptive actions to that such a malfunction of the power converter will not cause operational inefficiencies due to avoidable down-time of equipment.

In some instances, it is necessary to conduct routine maintenance or repair of power conversion equipment, which may require that a three phase or multiphase input be disconnected for safety reasons. Even if an AC input is disconnected, residual voltages may be present inside the power converter for a significant period of time and as many as tens of seconds, and an unprepared repairperson may be prone to electric shock caused by such residual voltages.

BRIEF SUMMARY OF THE INVENTION

In an embodiment, the present disclosure provides a detection circuit comprising a converter configured to convert a multiphase alternating current (AC) input into a direct current (DC) output, a plurality of sensing diodes, each sensing diode being separately electrically connected to one phase of the multiphase AC input, at least one node arranged downstream from the plurality of sensing diodes relative to the multiphase AC input, a power source configured to output a power source voltage to the at least one node and plurality of sensing diodes, and a mask time generator configured to determine a node voltage at the at least one node and determine whether the node voltage persists for a predetermined mask time period.

BRIEF DESCRIPTION OF THE SEVERAL VIEWS OF THE DRAWINGS

Subject matter of the present disclosure will be described in even greater detail below based on the exemplary figures. All features described and/or illustrated herein can be used alone or combined in different combinations. The features and advantages of various implementations will become apparent by reading the following detailed description with reference to the attached drawings, which illustrate the following.

DETAILED DESCRIPTION OF THE INVENTION

Aspects of the present disclosure include systems and methods for detecting disconnections of one or more phases of a three phase or multiphase input to an AC-DC section of a power converter. The disclosed systems and methods provide significant performance and safety improvements to AC-DC converters, as electrical disconnections can be more easily detected and diagnosed with more specificity. In some aspects, the present disclosure provides for detection of which input in a three phase power input has experienced an electrical disconnection. In some aspects, the disclosed features provide safety benefits by immediately eliminating the potential for electric shock upon detection of an electrical disconnection. In some aspects, the disclosed features provide safety benefits by discharging residual voltages, thereby decreasing the likelihood of electric shock to a repairperson. Furthermore, by providing a more reliable and accurate electrical input disconnection detection, the present disclosure enables increased automated functionality, such as automatic triggering of redundancy measures, warning and/or alarm systems, and/or downstream protection measures.

Figure 1:
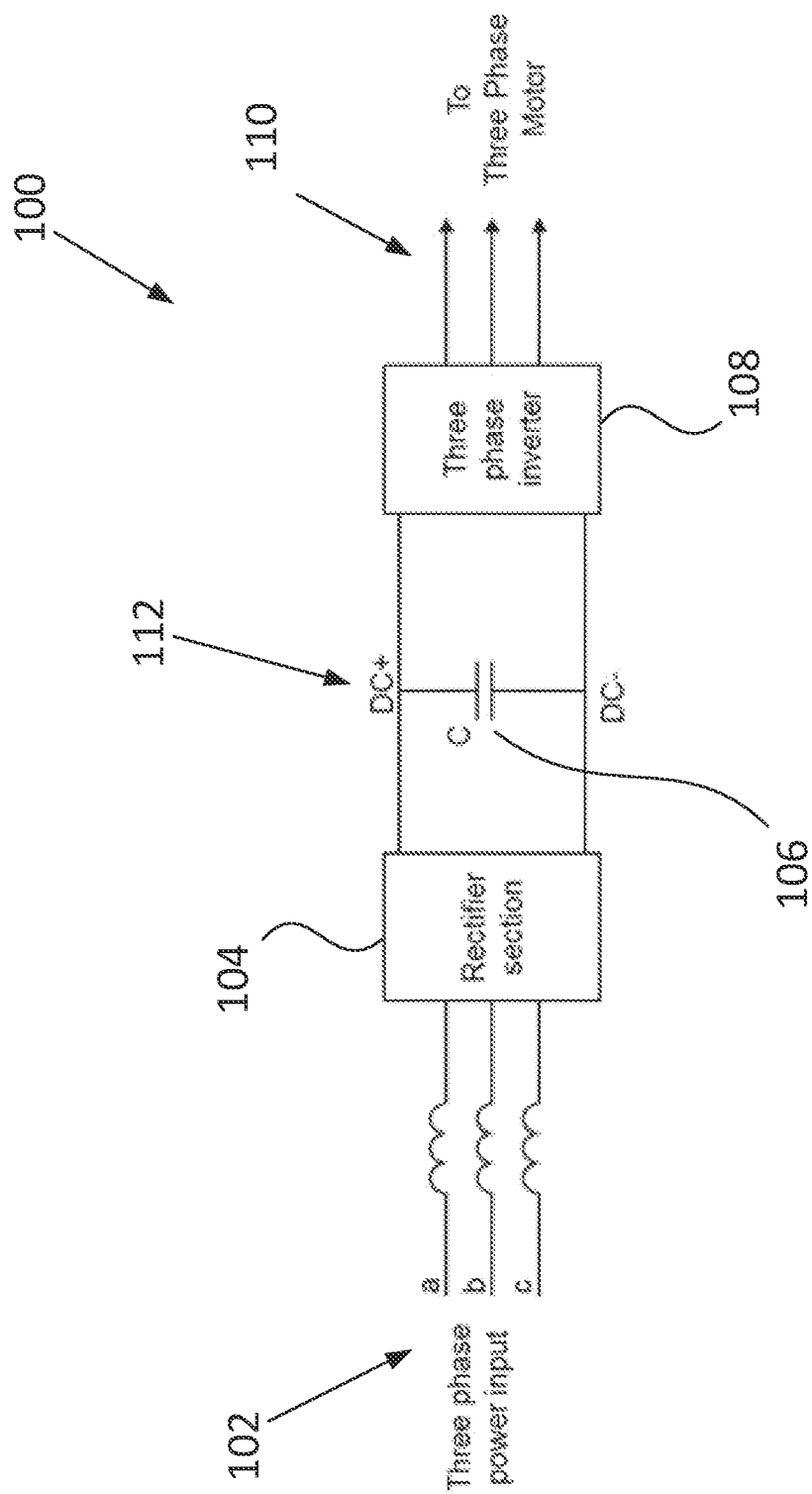
FIG. 1 illustrates a frequency converter.

FIG. 1 illustrates a simplified schematic of a frequency converter 100. The frequency converter 100 includes a three phase power input 102 that passes an alternating current (AC) input, such as an AC input from grid power, to a rectifier section 104. The rectifier section 104 converts the AC signal from the three phase power input 102 into a direct current (DC) signal. The DC signal is measured as a voltage potential across a DC bus 112, which in some cases includes a capacitor 106 (or other circuitry represented herein by capacitor 106). The DC signal from the DC bus 112 is then passed on to a three phase inverter 108, which is configured to convert the DC signal into a three phase power output 110. Depending on the use case of the frequency converter 100, the three phase power output 110 may be customized for operating a specialized motor or other equipment. Equipment and/or systems utilize a frequency converter 100 to convert AC power, such as grid power, to a usable form of AC power for operating equipment as needed.

Figure 2:
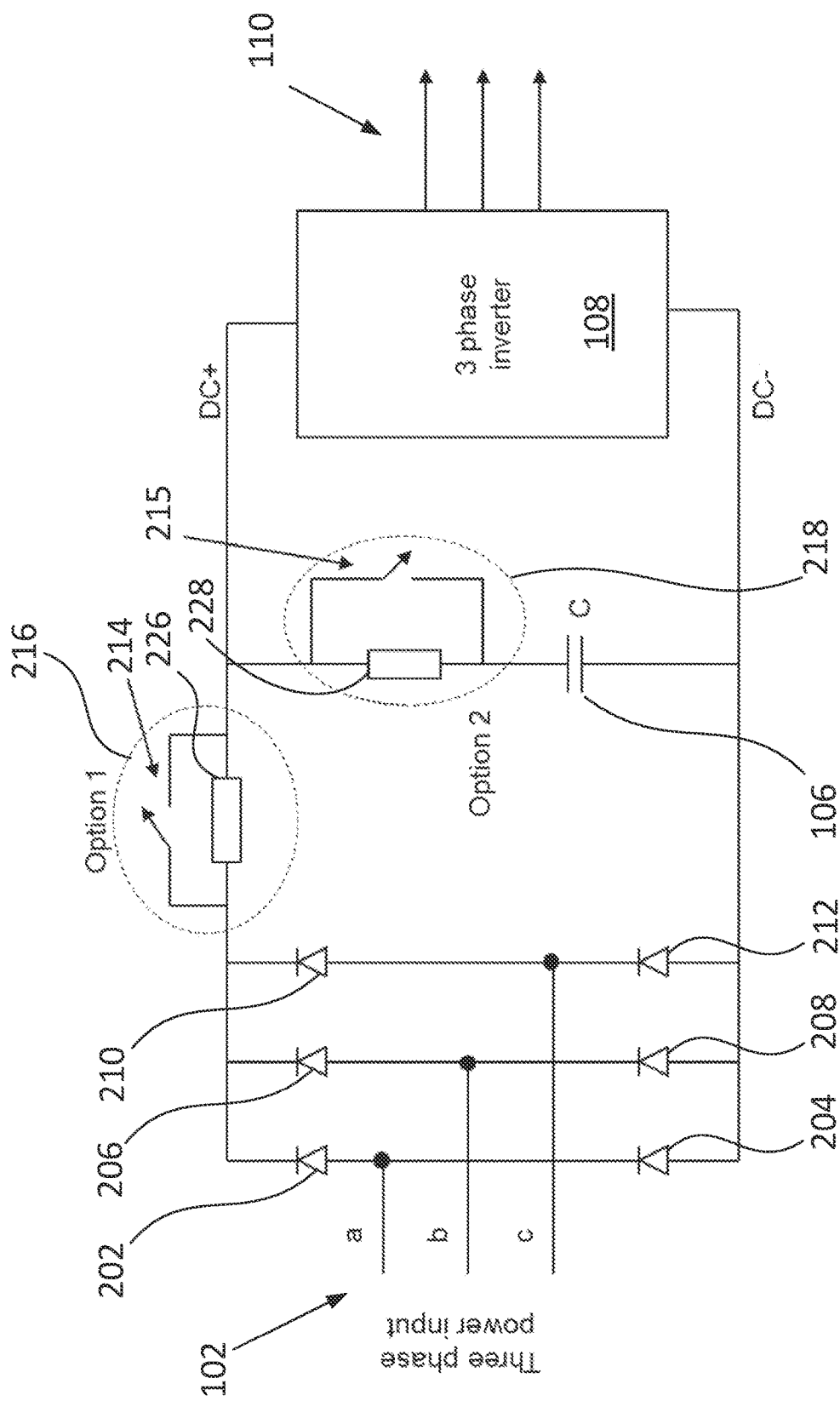
FIG. 2 illustrates the rectifier section of the frequency converter illustrated in FIG. 1.

FIG. 2 illustrates a more detailed view of the rectifier section 104 of the frequency converter 100 illustrated in FIG. 1. In rectifier section 104, the three phase power input 102 of the frequency converter 100 is electrically connected to a collection of diodes 202, 204, 206, 208, 210, 212. Specifically, two diodes of the six diodes 202, 204, 206, 208, 210, 212 are assigned to each phase of the three phase power input 102, with one set of diodes 202, 206, 210 configured to only pass positive downstream current from each phase and a second set of diodes 204, 208, 212 configured to pass negative downstream current from each phase. In this manner, a direct current potential is created across the DC bus 112 of the frequency converter 100. In the illustrated embodiment, two precharge configurations are included on a positive side of the DC bus, a first precharge contact configuration 216 and a second precharge contact configuration 218, which are each essentially the same in structure and may be implemented as alternative configurations. It will be readily understood that precharge circuitry can be implemented on the positive or negative side of the DC bus, although it is customarily drawn on the positive side. Each precharge contact configuration 216, 218 includes one precharge contact 214, 215 and a precharge resistor 226, 228. Each configuration, regardless of which is used, is configured to limit an inrush of current through rectifier diodes 202, 206, 210 during charging of the DC bus capacitor 106 when power through the three phase power input 102 is initially applied. The resistors 226, 228 are configured to limit an inrush current, and when the DC bus capacitor 106 is fully charged, the precharge contacts 214, 215 are closed under command of a frequency converter controller.

Figure 3:
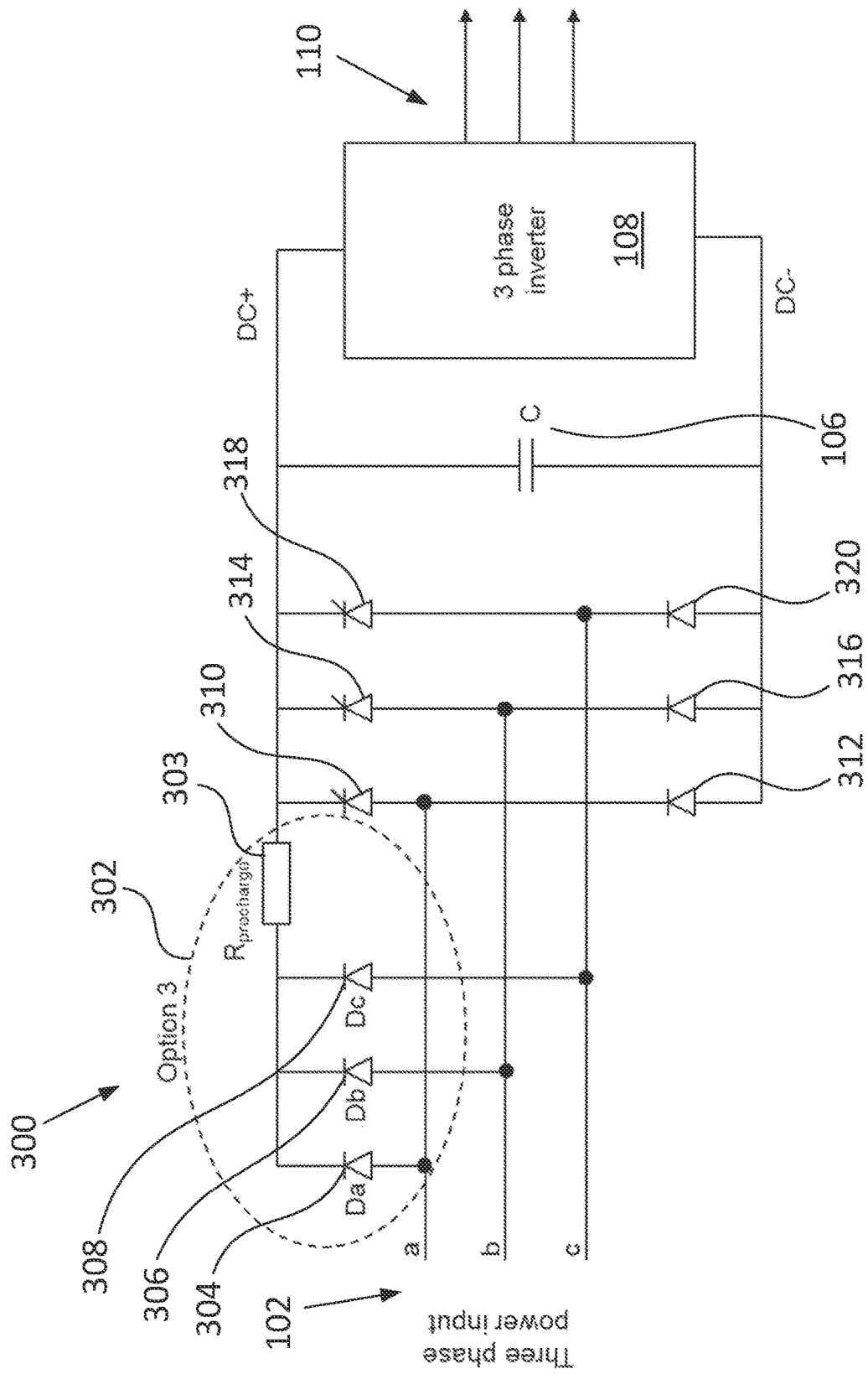
FIG. 3 illustrates an alternate rectifier section of the frequency converter illustrated in FIG. 1.

FIG. 3 illustrates an alternate rectifier section 300 of the frequency converter 100 illustrated in FIG. 1. The alternate rectifier section 300 includes a third precharge configuration 302 that may be implemented as an alternative to the first and second precharge contact configurations 216, 218. In the third precharge configuration 302, a three phase power input 102 passes an AC signal to upper diodes 304, 306, 308, with each phase of the three phase power input 102 being passed to a separate upper diode 304, 306, 308. The upper diodes 304, 306, 308 are configured to allow only positive downstream current from the three phase power input 102. The third precharge configuration 302 then passes current from each of the diodes to a precharge resistor 303. The alternate rectifier section 300 also includes lower diodes 312, 316, 320 that are configured to pass negative downstream current from the three phase power input 102 toward a negative side of the DC bus capacitor 106. Three silicon-controlled rectifiers (SCRs) 310, 314, 318 are included downstream of the three phase power input 102 and the upper diodes 304, 306, 308, with one SCR 310, 314, 318 assigned to each phase of the three phase power input 102. The third precharge configuration 302, via the upper diodes 304, 306, 308 and precharge resistor 303, limit the charging current of the DC bus capacitor 106. When the DC bus capacitor 106 is substantially charged, the SCRs 310, 314, 318 are gated on under the control of a frequency converter controller.

Figure 4:
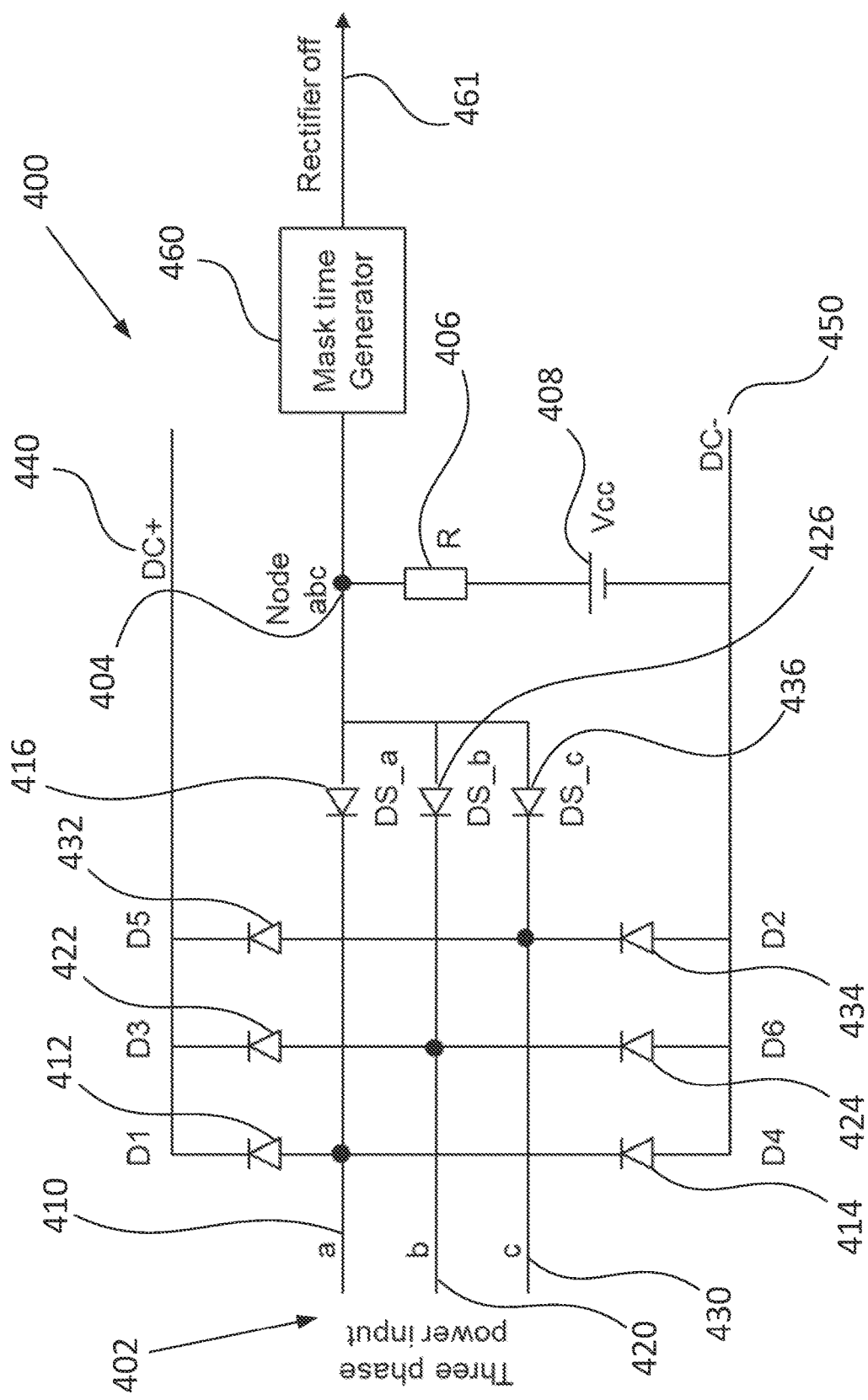
FIGS. 4-7 illustrate detection circuits according to embodiments of the present disclosure.

FIG. 4 illustrates an input phase loss detection circuit 400 according to an embodiment of the present disclosure. The detection circuit includes sensing diodes 416, 426, 436, a DC power supply (Vcc) 408, a bias resistor (R) 406, and a mask time generator. In the illustrated detection circuit 400, three sensing diodes 416, 426, 436 are included, each being electrically connected downstream of one phase of a three phase power input 402. In the illustrated embodiment, the three phase power input 402 includes a first phase 410, a second phase 420, and a third phase 430. The first phase 410 is connected to two diodes, diode (D1) 412 and diode (D4) 414. The first phase 410 is also connected to sensing diode (DS_a) 416. The second phase 420 is connected to two diodes, diode (D3) 422 and diode D6 424. The second phase 420 is also connected to sensing diode (DS_b) 426. The third phase 430 is connected to two diodes, diode (D5) 432 and diode (D2) 434. The third phase 430 is also connected to sensing diode (DS_c) 436. Upper diodes 412, 422, 432 are configured to allow positive downstream current to flow and to form a positive DC voltage 440. Lower diodes 414, 424, 434 are configured to allow negative downstream current to flow and form a negative DC base voltage 450. The sensing diodes 416, 426, 436 are high voltage, low current sensing diodes and are electrically connected to form a node 404. The node 404 is then electrically connected to mask time generator 460 and bias resistor 406.

The detection circuit 400 is configured to sense and respond to a variety of scenarios based on function of the three phase power input 402 and the upper and lower diodes 412, 422, 432, 414, 424, 434. When power is received via three phase power input 402, one or more of the lower diodes 414, 424, 434 conduct electricity during some portion of a period of the AC input, the period for an AC input of 50 Hz being 20 milliseconds (ms) and the period for an AC input of 60 Hz being 16.667 ms. When one or more of the lower diodes 414, 424, 434 are properly conducting, the voltage at node 404 is at or near the base voltage 450, which is indicative of a logic state of 0 (zero) at the node 404. This is because a current path between the DC power supply 408, the bias resistor 406, one or more of sensing diodes 416, 426, 436, and one or more of lower diodes 414, 424, 434 exists. When the AC power input is not received via the three phase power input 402, all three lower diodes 414, 424, 434 are off and the node 404 is at a voltage potential equal to the voltage provided by the DC power supply 408. This causes a logic state of 1 (one) at node 404, because there is no current flow path from the DC power supply 408 through sensing diodes 416, 426, 436.

When there is a substantial electrical load on a DC bus (between the positive DC voltage 440 and the negative DC base voltage 450), the diodes 414, 416, 418 conduct for about 120 electrical degrees each and in sequence. Thus, one of the three diodes 414, 416, 418 is always conducting at a given time, and node 404 will therefore be held at a logical state of 0. At partial loads or at very small loads on the DC bus, such as a load caused by a power input being connected while a unit is in a "standby mode," for example, the duration during which each diode 414, 416, 418 conducts becomes smaller and smaller, but is never zero. Therefore, in a so-called "standby mode," the diodes 414, 416, 418 may only conduct for about 10-20 electrical degrees. As a result, the node 404 stays at a logical state of 1 for most of the time, but periodically falls to a logical state of 0 for a very short time during each input power supply period. Thus, a mask time generator 460, as described in greater detail hereafter, is required to monitor the node 404 and declare an input disconnected only when node 404 is persistently at a logical state of 1 for a sufficiently long period of time, which may be a period of time that is a multiple of the grid voltage period to ensure input phase loss detection has not been mis-detected.

If the node 404 has a logic state that is "low," then this indicates that one or more of the lower diodes 414, 424, 434 are conducting, and that therefore the rectifier system is connected to the three phase power input and receiving AC power. If the node 404 has a logic state that is "high," then this indicates that all of the lower diodes 414, 424, 434 are not conducting at that instant and, therefore, a possibility that the rectifier system is disconnected from the three phase power input 410 or from an AC power input.

The mask time generator 460 increases certainty that a "high" logic state at node 404 is due to disconnection of the AC power supply. The mask time generator has a generator output 461 configured to indicate a rectifier logic state. Specifically, the mask time generator 460 outputs a rectifier logic state that is "high" to indicate that the AC power input is disconnected when node 404 is in a "high" state for a predetermined period of time, referred to herein as a mask time. This assures, for instance, that a measured condition of the lower diodes 414, 424, 434 being disconnected from an AC input power (corresponding to a logic state of "high" at node 404) persists for at least the mask time. In some embodiments, the mask time is between approximately one to five times the period of the AC power input. For example, the mask time may be from 20 ms to 100 ms for a 50 Hz AC power input, and from 16.667 and 100 ms for a 60 Hz AC input. The logic state, in the form of a signal, may be passed via the generator output 461 from mask time generator 460 to a frequency converter controller, which may be programmed to take necessary action depending on the signal. For example, the frequency converter controller may initiate a warning or alert through a user interface (UI) or alarm to indicate that AC power input disconnect has been detected. It will be readily appreciated that the frequency converter controller may be further configured to initiate a variety of tasks, outputs, or actions based on the logic state of the generator output 461, such initiating redundancy features, initiating safety procedures to make a disconnected system more safe for maintenance or repair, communicating the generator output logic status with further local and/or remote systems, and the like. In some embodiments, the mask time generator 460 may be implemented as a microcontroller, using field programmable gate arrays (FPGAs), and/or using discrete analog and digital integrated circuits (ICs). In some embodiments, the mask time generator 460 is implemented inside a microcontroller already included in a frequency converters for carrying out basic frequency converter operations.

Figure 5:
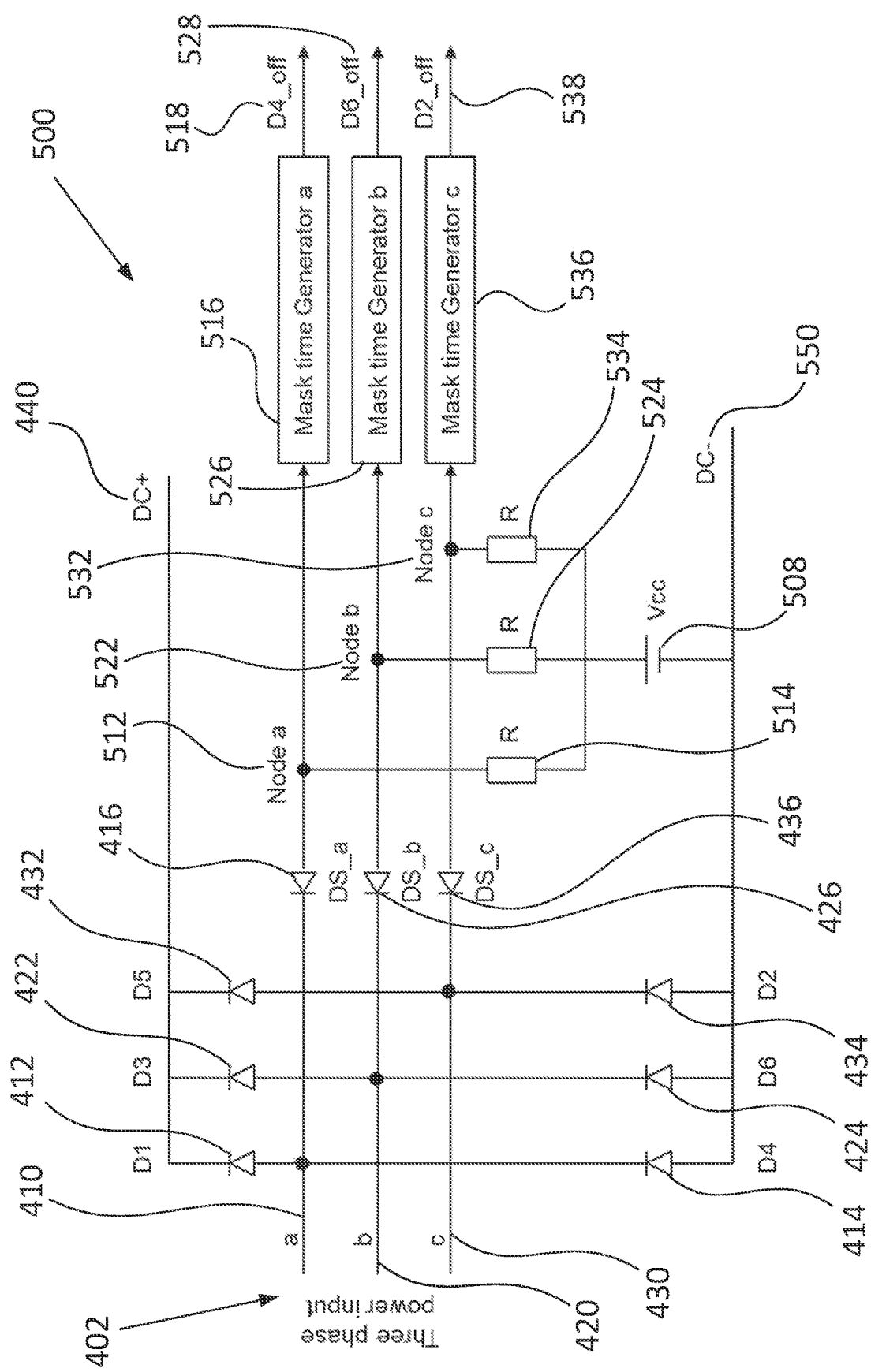

FIG. 5 illustrates a detection circuit 500 according to an embodiment of the present disclosure that is configured for more detailed input phase loss detection. Like the detection circuit 400 of FIG. 4, the detection circuit 500 illustrated in FIG. 5 includes a three phase power input 402 with each of three phases 410, 420, 430 being connected to respective upper diodes 412, 422, 432 and lower diodes 414, 424, 434 of a rectifier diode circuit. The detection circuit 500 also similarly includes sensing diodes 416, 426, 436 arranged on each of the phases 410, 420, 430. In the illustrated embodiment, however, each sensing diode 416, 426, 436 is associated with a separate node 512, 522, 532, and thereby separate bias resistors 514, 524, 534 and separate mask time generators 516, 526, 536. Specifically, a first sensing diode 416 associated with a first phase 410 is electrically connected to a first node 512, which in turn is connected to a first bias resistor 514 and a first mask time generator 516 that outputs a first generator output 518. A second sensing diode 426 associated with a second phase 420 is electrically connected to a second node 522, which in turn is connected to a second bias resistor 524 and a second mask time generator 526 that outputs a second generator output 528. A third sensing diode 436 associated with a third phase 430 is electrically connected to a third node 532, which in turn is connected to a third bias resistor 534 and a third mask time generator 536 that outputs a third generator output 538. Each of the bias resistors 514, 524, 534 are electrically connected to a DC power supply 508 that produces a base voltage 550.

The detection circuit 500 operates in a similar manner to that of the detection circuit 400 of FIG. 4, except that the logical state of each node 512, 522, 532 corresponding to a state of each lower diode 414, 424, 434, respectively, can be individually detected by separate corresponding mask time generators 516, 526, 536. Thus, the detection circuit 500 enables detection of individual failures or disconnects of each phase 410, 420, 430 as opposed to detection overall of all three phases 410, 420, 430 together. In some embodiments, the detection circuit 500 also enables detecting failure of a fuse for an individual phase based on detection of a failure within the individual phase. Because the logical state of each node 512, 522, 532 represents the operational state of each respective lower diode 414, 424, 434, each respective mask time generator 516, 526, 536 can also provide more detailed information to a frequency converter controller configured to receive each generator output 518, 528, 538. The frequency converter controller may thus process or communicate more detailed status data to provide more detailed status reports, initiate more detailed diagnostic, redundancy, or safety measures, or the like. In some embodiments, the frequency converter controller may be configured to reduce output power and/or current capacity of an inverter when operating upon detecting via the detection circuit that the system is operating on a single-phase supply.

The detection circuit 500 may be more readily understood by the following hypothetical scenario that is illustrative only, and represents only one of numerous scenarios that may be encountered and properly handled by the detection circuit 500. The three phase power input 402 may be properly connected to AC input power and each phase 410, 420, 430 may likewise be properly and normally functioning. However, the connection between diode (D4) 414 and the first phase 410 may be lost due to, for example, fatigue of a physical connection point. The detection circuit 500 would detect a logical state of "high" at node 512, corresponding to a disconnection of the first phase 410, and a logical state of "low" at nodes 522, 532 indicating nominal performance of the second and third phases 420, 430. The first mask time generator 516 may output a logical state of "high" to first generator output 518 upon determining that the logical state of "high" at node 512 persists beyond a predetermined time period. The second and third mask time generators 526, 536 would output logical states of "low" to each of the second and third generator outputs 528, 538, respectively. A frequency converter controller would then receive each of the first, second, and third generator outputs. Based on the "high" state of the first generator output 518, the frequency converter controller may update a UI to indicate that the first phase 410 is disconnected or trigger a warning or alarm indicating disconnection of the first phase 410. Depending on other conditions, the frequency converter controller may determine that initiating redundancy or safety measures may be necessary. For example, the frequency converter controller may disconnect the entire electrical system or sub-system from AC power to allow safe handling and repair of diodes or fuses connected to the first phase. In some embodiments, the frequency converter controller may also initiate communication or action based on a "low" state of the nominally operating phases, such as displaying a monitoring status to a UI.

By improving the level of detail of disconnect detection, the detection circuit 500 provides a variety of advantages over conventional systems. For example, maintenance or repair time and cost may be reduced, as workers are able to more quickly identify failure points and perform maintenance or repair work accordingly. Contingency operations that were previously not possible to implement in conventional systems may also be implemented by the frequency converter controller. For example, upon detecting that a single phase has failed or disconnected, the frequency converter controller may reduce the load on remaining operational phases to ensure that the power demands of the system do not cause a spike in power drawn by other parts of the rectifier, which may cause damage to the remaining parts of the rectifier.

Figure 6:
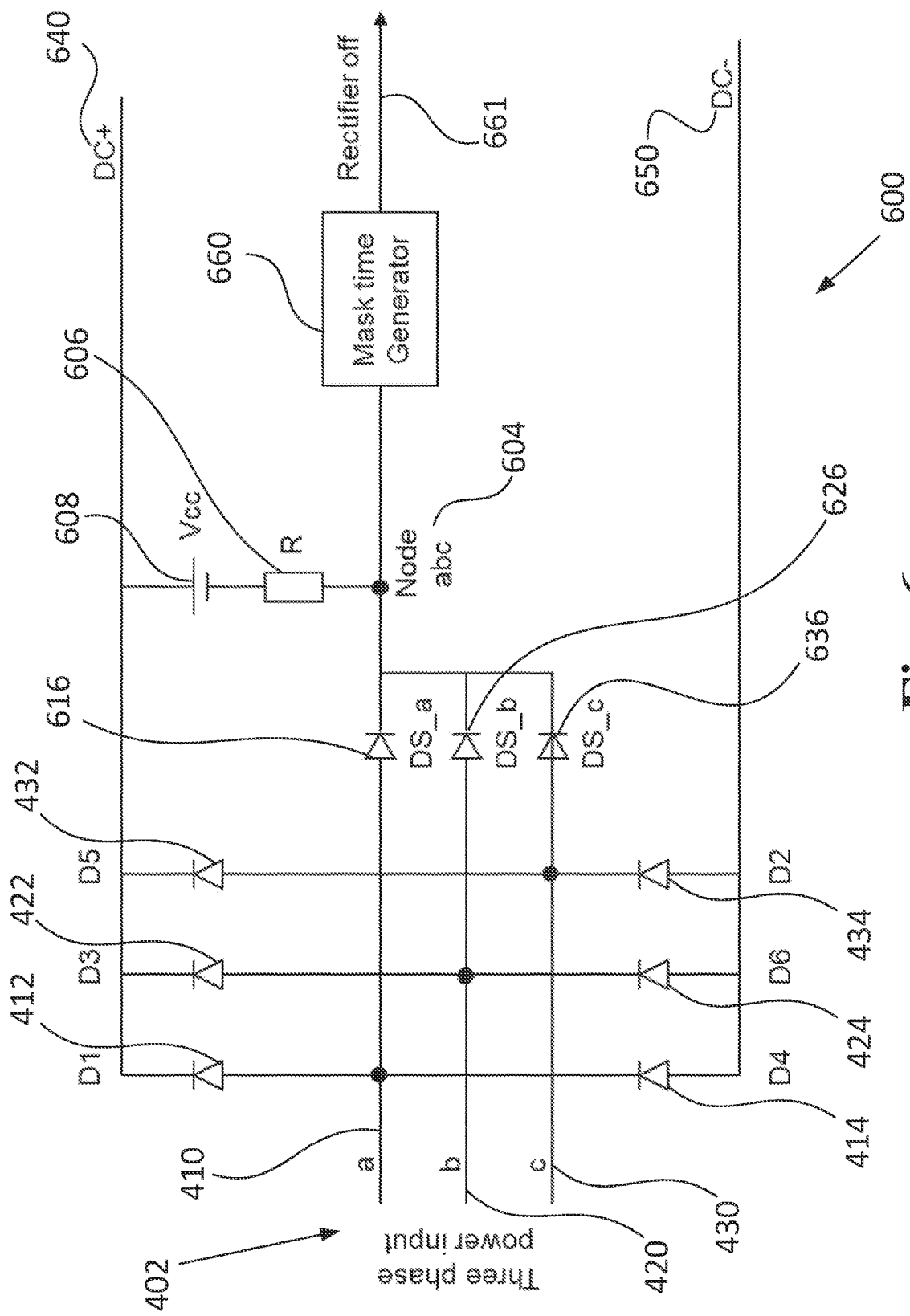

FIG. 6 illustrates a detection circuit 600 according to an embodiment of the present disclosure. The detection circuit 600 operates in a similar manner to the detection circuit 400 of FIG. 4, but sensing diodes 616, 626, 636 are instead arranged to prevent upstream current flow towards the three phase power input 402. The sensing diodes 616, 626, 636 are electrically connected downstream via a node 604, which is also electrically connected to a mask time generator 660 and a bias resistor 606. A power supply (Vcc) 608 is also included downstream of both the bias resistor 606 and upper diodes 412, 422, 432. The mask time generator 660 is configured to output a generator output 661. The general logical states and operation of the detection circuit 600 are similar to that of the detection circuit 400 of FIG. 4, but instead of comparing the voltage at node 604 to base voltage 650, the voltage at node 606 is compared against positive voltage 640, the voltage of power supply 608 is referenced against positive voltage 640, and the detection circuit is configured to detect disconnection of upper diodes 412 422, 432 instead of lower diodes 414, 424, 434. For example, when one or more of the upper diodes 412, 422, 432 are properly conducting, the voltage at node 604 is at or near the positive voltage 640, which is indicative of a logic state of 0 (zero) at the node 604. The mask time generator 660 is likewise configured to determine, based on the logical state of the node 604, whether there is a disconnection of the system from an AC power input and output a logical state via generator output 661 accordingly.

Figure 7:
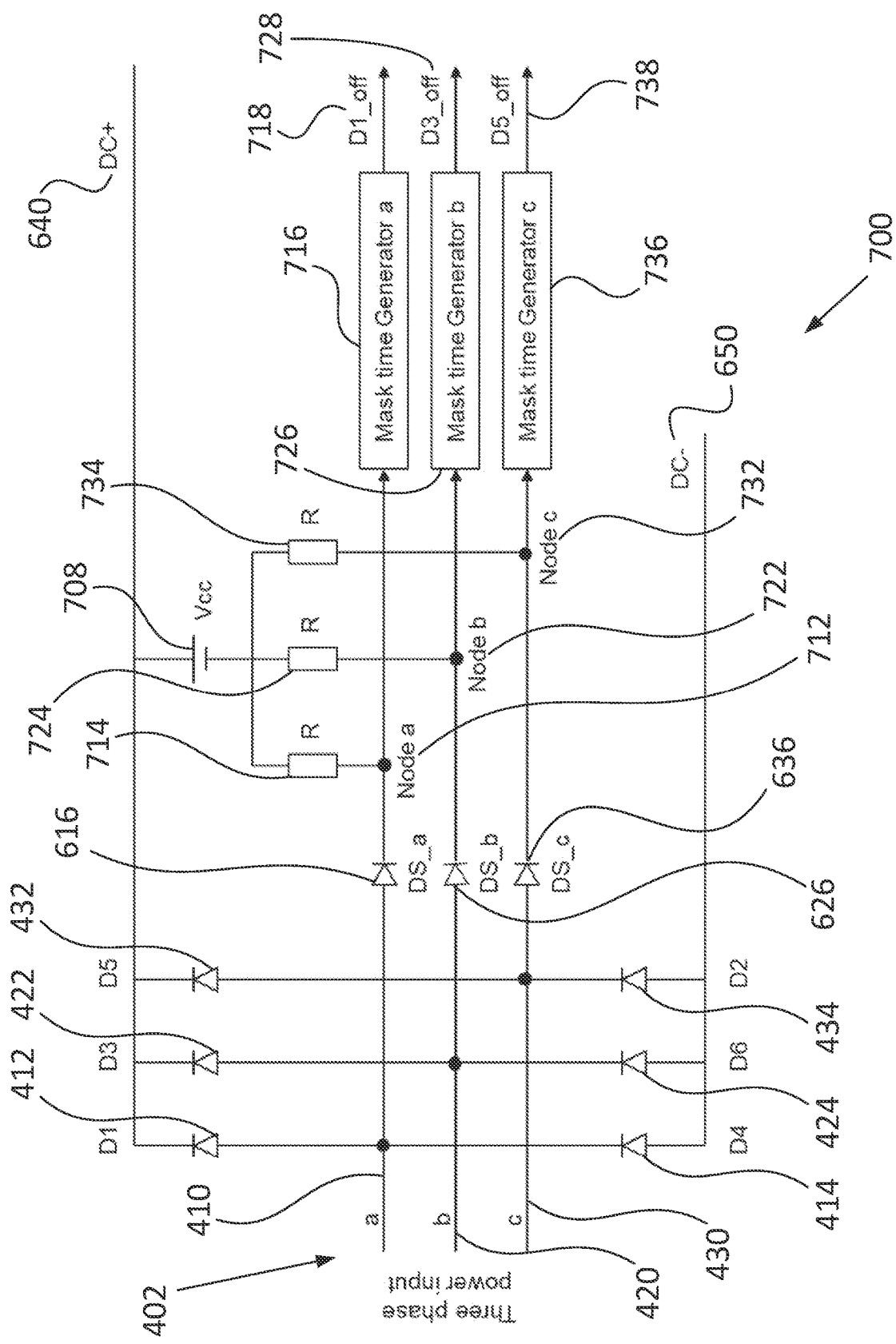

FIG. 7 illustrates a detection circuit 700 according to an embodiment of the present disclosure. The detection circuit 700 operates in a similar manner to the detection circuit 500 of FIG. 5, but sensing diodes 616, 626, 636 are include instead and are arranged to prevent upstream current flow towards the three phase power input 402. The first phase 410 is electrically connected with a first sensing diode 616, which connects subsequently to first node 712 and then to first bias resistor 714. The first node 712 is also connected to first mask time generator 716, which is configured to output to a first generator output 718. The second phase 420 is electrically connected with a second sensing diode 626, which connects subsequently to second node 722 and then to second bias resistor 724. The second node 722 is also connected to second mask time generator 726, which is configured to output to a second generator output 728. The third phase 430 is electrically connected with a third sensing diode 636, which connects subsequently to third node 732 and then to third bias resistor 734. The third node 732 is also connected to third mask time generator 736, which is configured to output to a third generator output 738. The first, second, and third bias resistors 714, 724, 734 are configured to electrically connect to a power supply 708.

Instead of detection of the conduction state of individual lower diodes 414, 424, 434, the detection circuit 700 is configured to detect the conduction state of individual upper diodes 412, 422, 432 and/or individual corresponding phases 410, 420, 430. The logical states of each node 712, 722, 732 is similar to those of the detection circuit 400, but the reference voltage for the power supply and for determining a "high" versus "low" state is the positive voltage 740, not base voltage 650.

It will be readily appreciated that the detection circuits of FIGS. 6 and 7, in addition to having structural, operational, and logical similarities to the detection circuits of FIGS. 4 and 5, respectively, also have many of the same features, advantages, and applications as those previously described herein.

Figure 8:
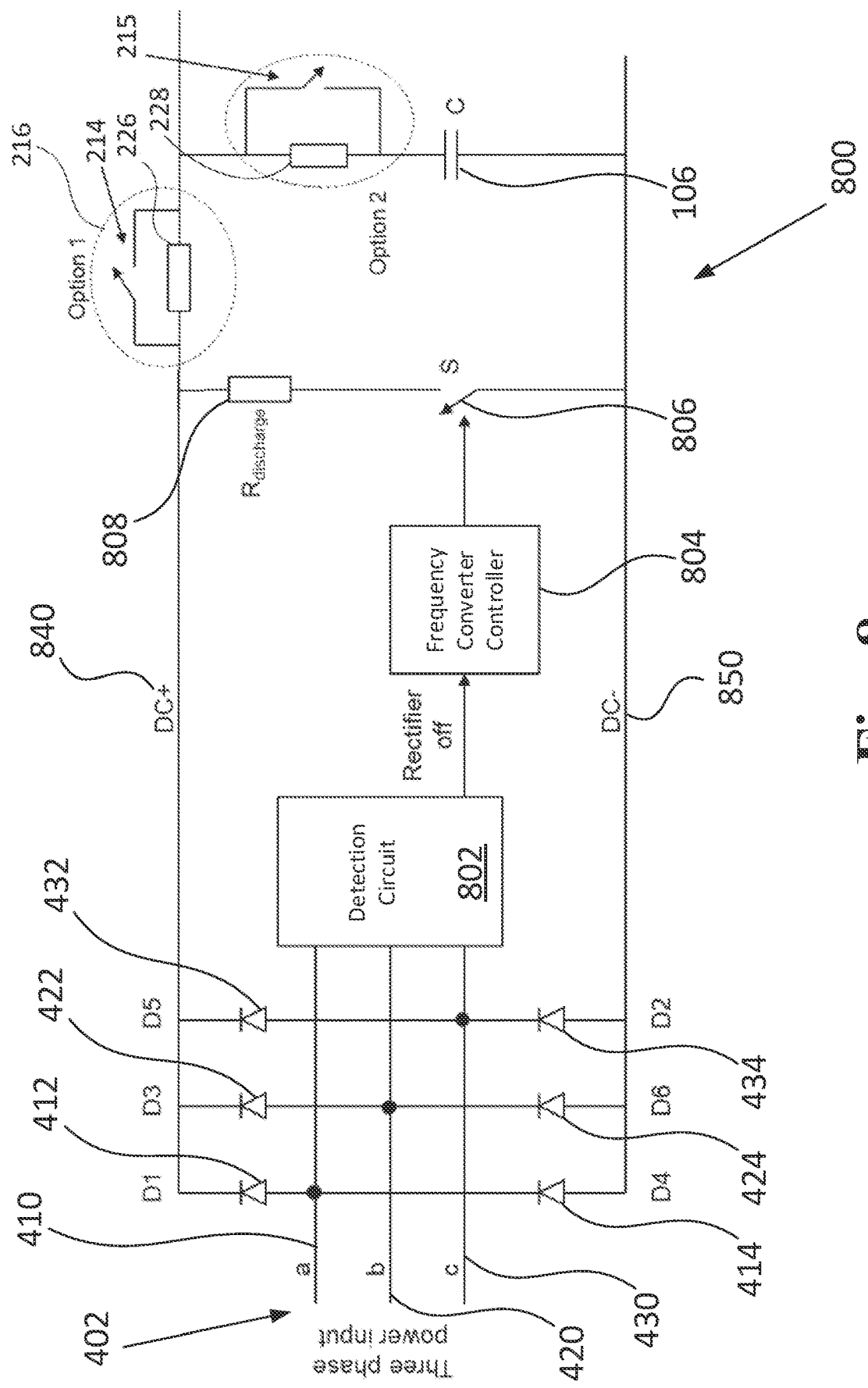
FIG. 8 illustrates a detection circuit and a discharge circuit.

FIG. 8 illustrates a detection and residual voltage discharge system 800 including a detection circuit 802, frequency converter controller 804, discharge resistor 808, and switch 806. The detection circuit 802 may include a detection circuit according to any detection circuit disclosed in the present disclosure, including the detection circuits illustrated in FIGS. 4-7. As described above with regard to FIGS. 1 and 2, prior art systems may include capacitors 106 (or other components which behave electrically like capacitors) across a DC bus. This is a potential safety hazard, as the capacitor 106 may carry a charge after the three phase power input 402 stops receiving AC power, or even after other conventional isolation measures are taken. In fact, in some cases full discharge of the capacitor 106, and therefore the power conversion system, can take tens of seconds, and in some cases more than 30 seconds, subverting the expectation of an unwary worker and creating a substantial safety hazard.

In the illustrated embodiment, the detection circuit 802 outputs one or more status signals to the frequency converter controller 804, which is configured to control the open/close state of switch 806. Upon detection by the detection circuit 802 of a phase disconnection, the frequency converter controller 804 may, in addition to shutting down the power conversion system or otherwise isolating it from AC power, close switch 806, thereby immediately discharging the capacitor 106 by providing an electrical connection between positive reference voltage 840 and negative reference voltage 840 via discharge resistor 808. This is particularly advantageous as a safety feature, as automated and immediate discharge of remaining voltage in the power conversion system can be performed well before a worker performing maintenance, repair, or debugging can interact with the system after a shutdown.

Although descriptions above describe the discharge as "immediate," it will be readily understood that discharge is immediate in the sense that it is safe, but that discharge is never instantaneous in real-world applications. Accordingly, the discharge time can be determined approximately by obtaining the product of the resistance of the discharge resistor 808 and the capacitance of the capacitor 106, and multiplying the product by four. The value of the resistance of the discharge resistor 808 and therefore be adjusted or selected based on a discharge time requirement set forth by a desired safety protocol or standard.

In some embodiments, the frequency converter controller 804 is optional, and detection circuit 802 may be configured to directly control the switch 806 rather than passing a signal to the frequency converter controller 804. In some embodiments, the discharge resistor 808 is not a single resistor per se, but one or more components which electrically behave as a resistor.

In some embodiments, the detection and residual voltage discharge system 800 may be modified by eliminating the discharge resistor 808 and thereby utilizing a precharge resistor 226 or 228 to instead serve the function of discharge resistor 808 as described above. In such embodiments, it is important to ensure that before the switch 806 is turned on by the frequency converter controller 804, a precharge contact 214 or 215 is opened. In this case, the discharge time would be the same as the charge time. The discharge resistor 808 cannot be omitted if the precharge scheme of alternate rectifier section 300 (Option 3) from FIG. 3 is used.

Figure 9:
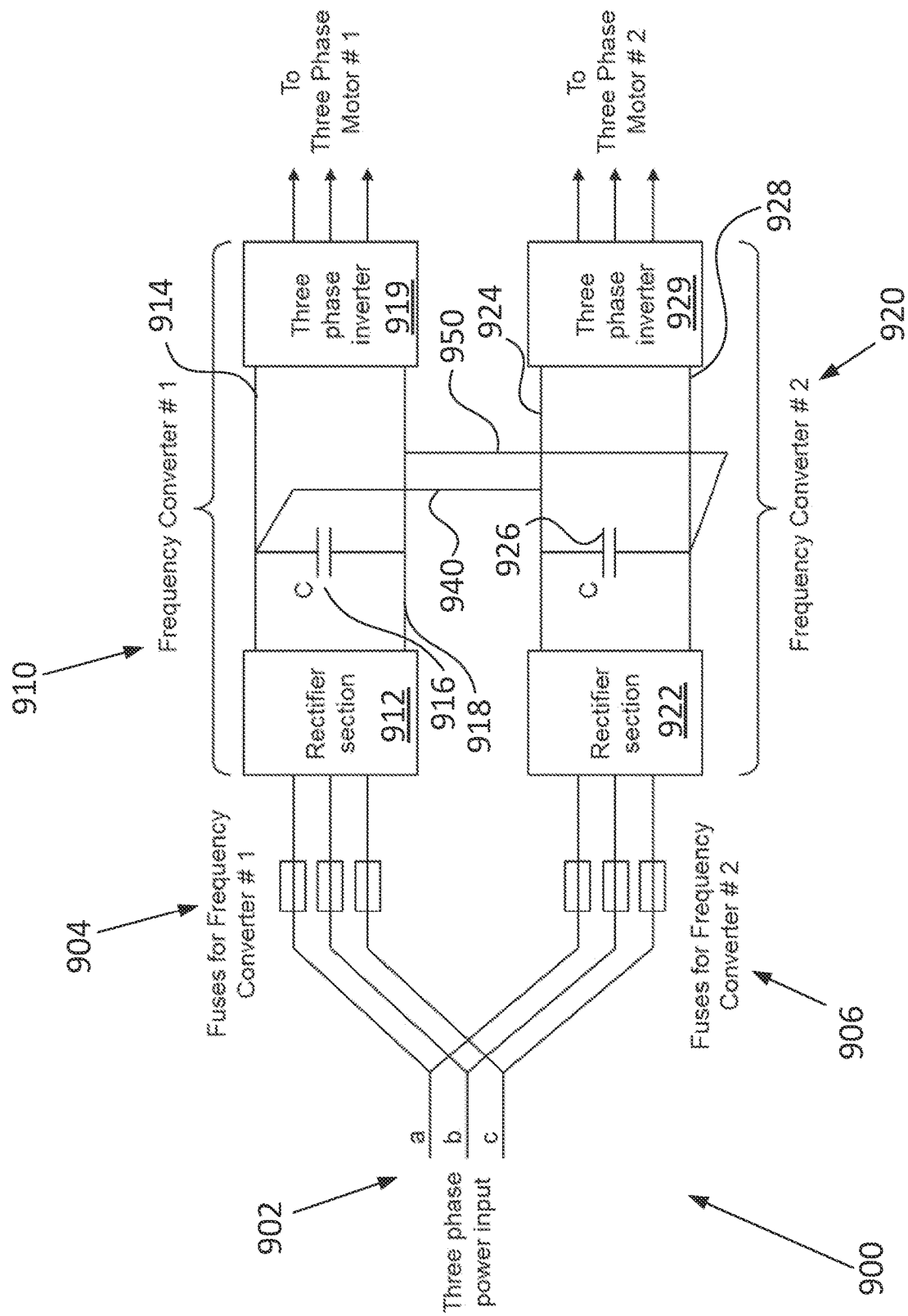
FIG. 9 illustrates a power conversion system including a shared DC bus connection.

FIG. 9 illustrates a power conversion system 900 including a shared DC bus connections 940, 950 between a first frequency converter 910 and a second frequency converter 920. Each of the first and second frequency converters 910, 920 are configured to receive AC power via a three phase power input 902. First fuses 904 are included, with one fuse on each phase of the three phase power input 902 to protect the first frequency converter 910. Likewise, second fuses 906 are included, with one fuse on each phase of the three phase power input 902 to protect the second frequency converter 920. In some embodiments, circuit breakers may be used in place of fuses 904, 906. In some embodiments, one or more AC reactors may be included between the three phase power input 902 and the inputs to each frequency converter. The first and second frequency converters 910, 920 each include a rectifier section 912, 922, a three phase inverter 919, 929, and a DC bus capacitor 916, 926 between a positive DC bus reference 914, 924 and a negative DC bus reference 918, 928. The positive DC bus references 914, 924 are connected via a first shared DC bus connection 940 and the negative DC bus references 918, 928 are connected via a second shared DC bus connection 950. Each frequency converter 910, 920 is configured to supply output voltage to a separate downstream system, such as an AC motor.

Configurations such as those illustrated in FIG. 9 are sometimes referred to as "common AC-common DC" configurations. While only two frequency converters 910, 920 are included in the illustrated power conversion system 900, it will be readily appreciated that more than two frequency converters may be included by simply connecting additional rectifier sections via fuses to the three phase power input 902 and ensuring a common shared connection between positive and negative DC bus references. The main advantage of the illustrated configuration and similar configurations, is that regenerative energy from one system, such as an AC motor electrically connected to one of the frequency converters, can be consumed by other motors due to the shared DC bus connections. For example, regenerative energy produced by a motor connected to the three phase inverter 919 of the first frequency converter 910 may be transmitted via shared DC connections 940, 950 to power the motor connected to the three phase inverter 929 of the second frequency converter 920. However, when just one or more input phases to any frequency converter 910, 920 is/are compromised, the remaining rectifier circuits of one or more of the frequency converters 910, 920 may suffer an overload, because remaining operative rectifier sections will draw additional power to compensate. Furthermore, detection of which phase out of the shared phases has disconnected is not possible in conventional common AC-common DC systems. Thus, detection circuits such as those described in the present disclosure can be used in each frequency converter to ensure appropriate protections are carried out in the even that just one more of the input phases fails or is disconnected. In some embodiments, appropriate protections comprise displaying or otherwise communicating that a disconnection has occurred. In some embodiments, appropriate protections may comprise adjusting output power, such as reducing output power of a frequency converter that would otherwise be overloaded.

It will be readily understood that embodiments of the present disclosure may be applied, and their relative advantages realized, by implementing detection circuits in power conversion equipment using active front end or line converter front end circuits, rather than the passive rectifier circuits illustrated in the Figures or described in exemplary embodiments. Regardless of the AC-DC conversion topology used in a particular power conversion system, the disclosed embodiments provide detection circuits that help detect disconnections and thereby improve the functionality and safety of conventional power conversion systems. It will also be readily understood that while exemplary embodiments described herein primarily refer to a three phase power input, that the disclosed detection circuits may be readily modified to accommodate any multi-phase power input.

Figure 10A:
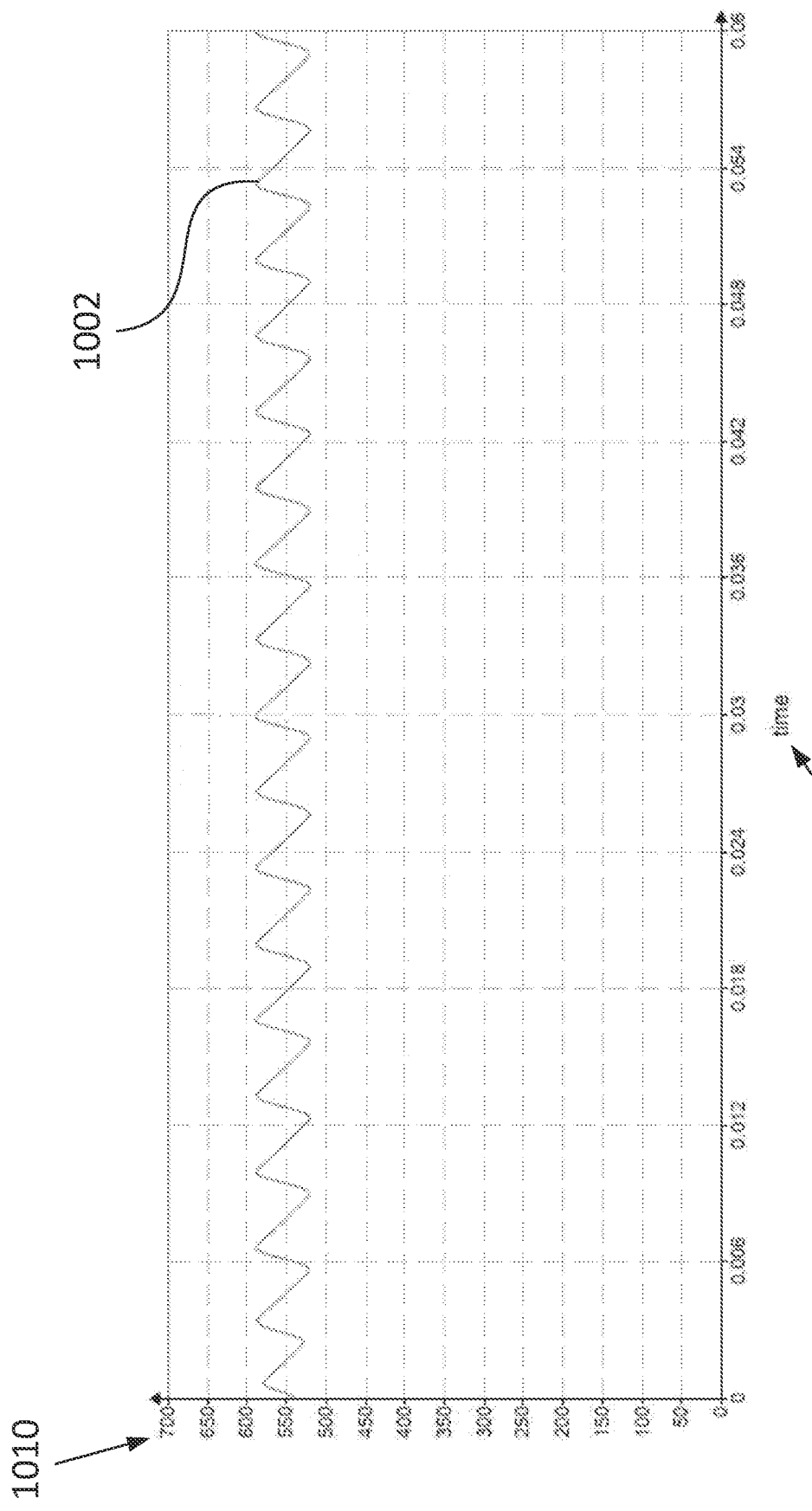
FIGS. 10A and 10B illustrate DC bus voltage measurements of an AC-DC converter with no phase disconnections at varying loads.
Figure 10B:
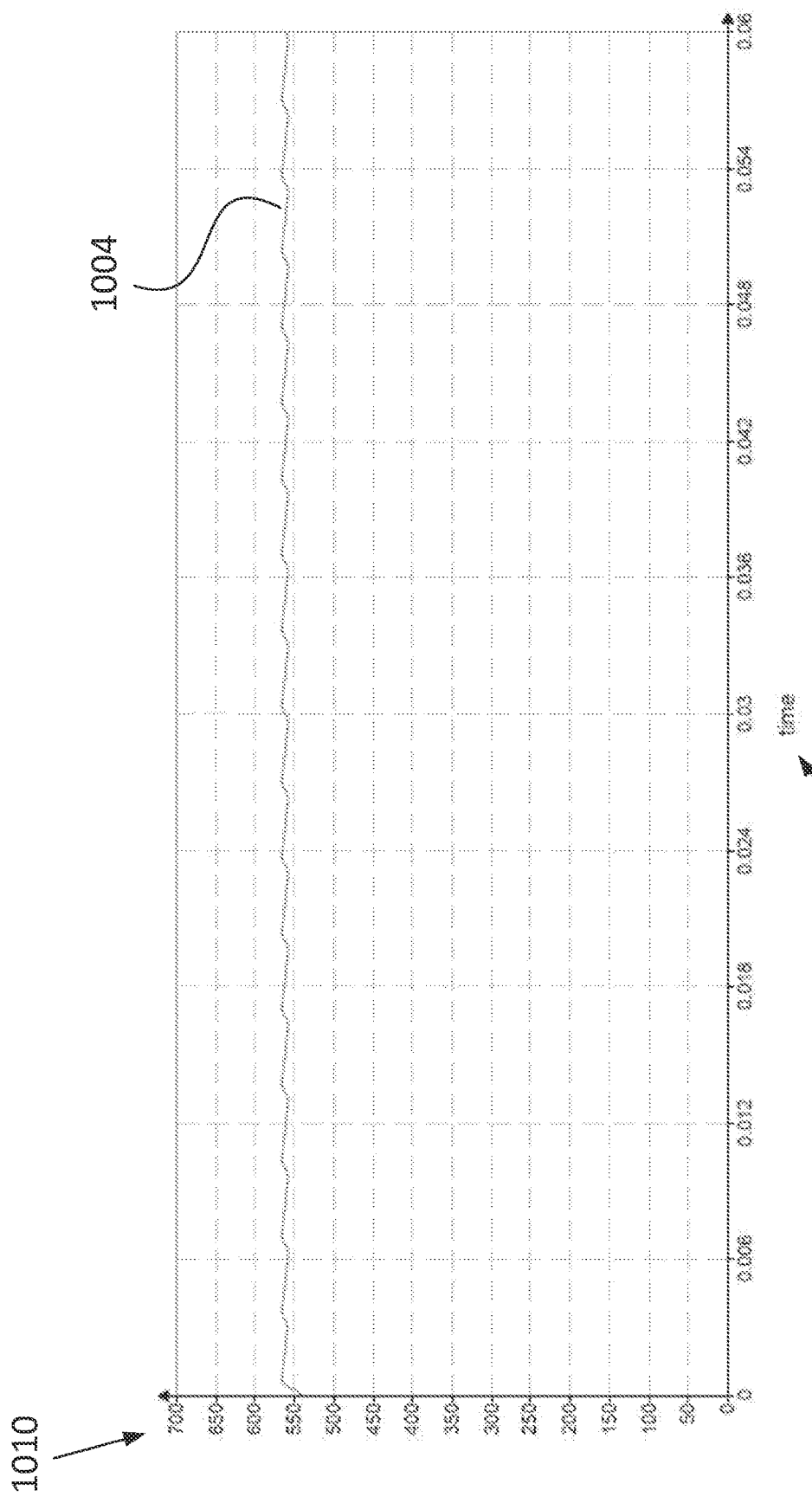
Figure 11A:
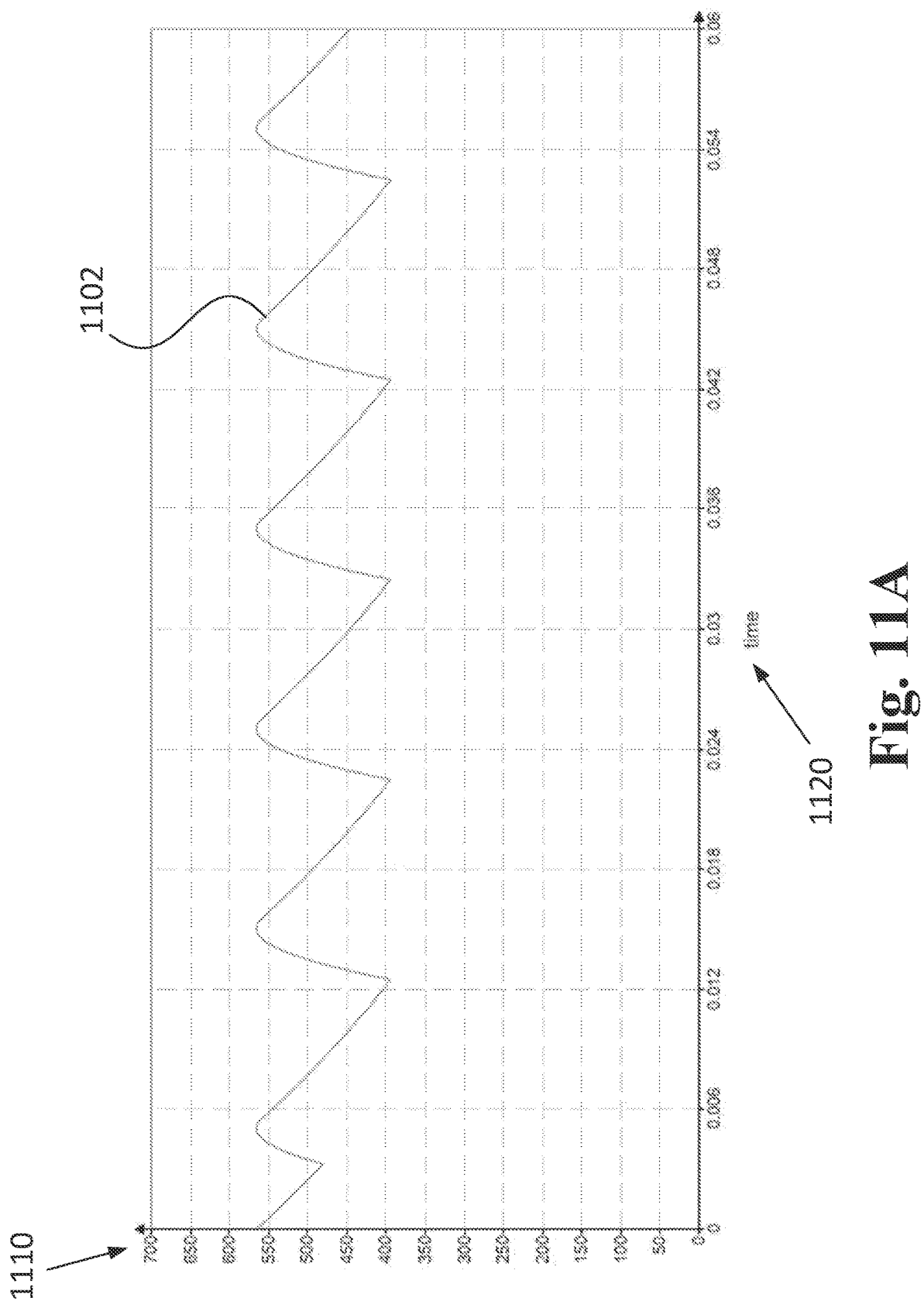
FIGS. 11A and 11B illustrate DC bus voltage measurements of an AC-DC converter with one phase disconnection at varying loads.
Figure 11B:
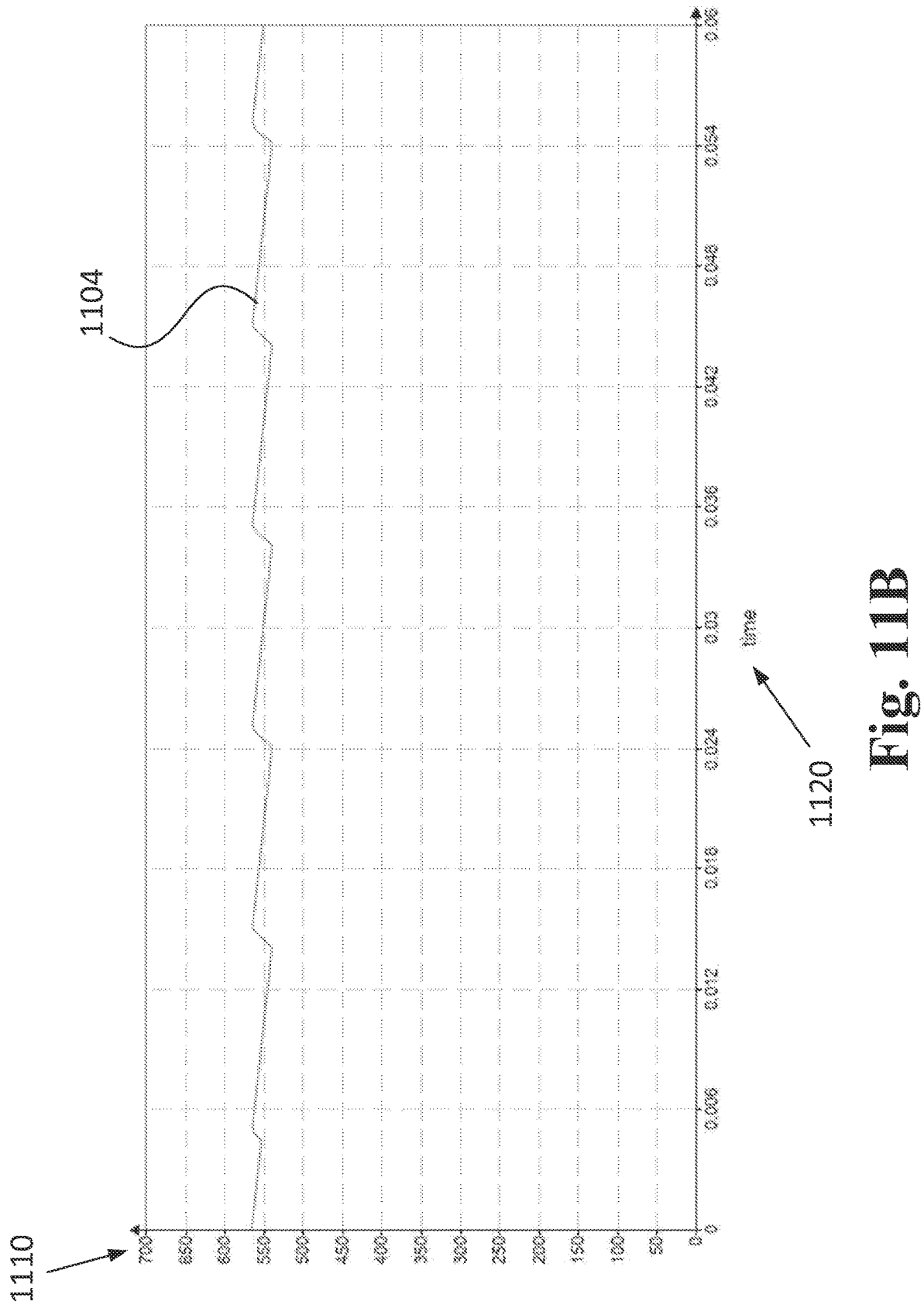

FIGS. 10A, 10B, 11A, and 11B illustrate experimental data obtained by measuring the voltage across the DC bus of AC-DC converters under varying conditions. FIGS. 10A and 10B illustrate DC bus voltage measurements of an AC-DC converter with no phase disconnections when an associated power converter is under a 100% load and a 10% load, respectively. Specifically, FIG. 10A illustrates a graph of DC bus voltage measurement 1002 across the DC bus of an AC-DC converter. The power converter, of which the AC-DC converter is a part, is under a 100% load. The DC bus voltage measurement is plotted as a voltage 1010 in volts against time 1020 in seconds. FIG. 10B likewise illustrates a similar graph of a DC bus voltage measurement 1004 in a power converter that is under a 10% load. FIGS. 11A and 11B illustrate DC bus voltage measurements of an AC-DC converter in a similar manner to FIGS. 10A and 10B, except that the AC-DC converter in which the DC bus voltage is measured has a disconnected input phase. FIG. 11A illustrates a graph of DC bus voltage measurement 1102 across the DC bus of an AC-DC converter in which one input phase is disconnected. The associated power converter is under a 100% load. FIG. 11B likewise illustrates a similar graph of a DC bus voltage measurement 1104 in a power converter that is under a 10% load. The voltage measurements illustrated in FIGS. 10A, 10B, 11A, and 11B were obtained using a 400V, 50 Hz AC power input.

In some conventional systems, the disconnection of a phase is determined by monitoring the voltage at the DC bus. As illustrated in FIG. 10A, the variation in voltage of a DC bus voltage when all input phases are connected and the system is under a 100% load is in the range of approximately 60 volts. In comparison, the variation in voltage of a DC bus when there is a phase disconnection and the system is under 100% load is in the range of approximately 120 voltage, as shown in FIG. 11A. Thus, a system that includes a controller configured to monitor DC bus voltage may determine that disconnection has occurred when the voltage variation increases beyond an acceptable threshold for a given load. However, an advantage of the detection circuits disclosed in the present disclosure is readily apparent when comparing the graphs of FIGS. 10B and 11B. Whereas the difference in voltage variation between FIGS. 10A and 11A is immediately apparent, the difference in voltage variation between the graphs in FIGS. 10B and 11B is not significantly reduced. Thus, a controller may not be able to reliably discern when a disconnection has occurred (as in FIG. 11B) at certain loads, particularly at lower loads. Embodiments of the present disclosure eliminate the need to rely solely on such software-based monitoring methods and also eliminate the need for more expensive voltage sensors that may be required for reliably discerning between fully operational and disconnection-related DC bus voltages. Embodiments of the present disclosure thus provide a more reliable and cost-effective detection alternative. Furthermore, in a common AC-common DC configuration, because DC bus reference voltages are shared over shared connections, if one rectifier is partially or fully disconnected, the second or other rectifiers may interfere with DC bus measurements or maintain DC bus voltages without significant voltage ripple, but with increased current stress on remaining active rectifier diodes. Embodiments of the present disclosure thus also increase the reliability of frequency conversion systems by reducing the likelihood of current overload on active rectifier diodes when one or more phase inputs have become disconnected.

Embodiments of the present disclosure including a controller are understood to include a processor and a memory, the processor configured to carry out instructions stored on the memory. For example, in some embodiments, the controller can be a microcontroller configured to monitor the generator output signal of one or more mask time generators and, depending on the received signal from the generator output, further pass on a serial or digital output signal. In some embodiments, the controller is a larger processor with additional peripherals or connected subsystems. For example, the controller may be part of a personal computing device, tablet, or other smart device configured to communicate with a power converter either wirelessly or via a wired serial communication port. It will be readily understood that the controller can thus be configured or adjusted to perform various functions based on received generator output signals, allowing for customized redundancy, safety, or protective measures to be implemented in a frequency converter system.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A detection circuit comprising:
a converter configured to convert a multiphase alternating current (AC) input into a direct current (DC) output;
a plurality of sensing diodes, each sensing diode being separately electrically connected to one phase of the multiphase AC input;
at least one node for each phase of the multiphase AC input, each node being arranged downstream from the plurality of sensing diodes relative to the multiphase AC input;
a power source configured to output a power source voltage to the at least one node and plurality of sensing diodes;
at least one mask time generator for each phase of the multiphase AC input, each mask time generator configured to determine a node voltage at the at least one node and determine whether the node voltage persists for a predetermined mask time period; and
at least one bias resistor for each phase of the multiphase AC input,
wherein each mask time generator is configured to determine whether a disconnection voltage, indicative of whether the mask time generator's respective phase is disconnected, persists for a predetermined period of time,
wherein each mask time generator is configured to output a phase status signal and each phase status signal is received by a frequency converter controller,
wherein the frequency converter controller is configured to prevent overload of operational phases that are not associated with the detected phase-specific failure by reducing loading on the operational phases.

2. The detection circuit of claim 1, further comprising at least one bias resistor between the power supply and each node.

3. The detection circuit of claim 1, wherein the predetermined mask time period is equivalent to at least one full period of a signal from a respective phase of the multiphase AC input.

4. The detection circuit of claim 3, wherein the predetermined mask time period is between 20 ms to 100 ms.

5. The detection circuit of claim 4, wherein the multiphase AC input has a frequency of 50 Hz.

6. The detection circuit of claim 1, wherein the frequency converter controller is configured to initiate, based on the phase status signal received from a respective mask time generator of the mask time generators, a disconnection warning, a redundancy measure, and/or an equipment protection measure.

7. The detection circuit of claim 1, wherein the frequency converter controller is configured to actuate, based on the phase status signal received from a respective mask time generator of the mask time generators, a safety switch, the safety switch being configured to discharge a DC bus voltage of the converter.

8. The detection circuit of claim 7, comprising a discharge resistor arranged on a positive voltage side of the safety switch, the safety switch being configured to discharge the DC bus voltage through the discharge resistor.

9. The detection circuit of claim 7, comprising a precharge resistor and precharge contact arranged on a positive voltage side of the safety switch, the precharge contact being configured to open before the safety switch is actuated to discharge the DC bus voltage.

10. A method of determining whether a disconnection between a frequency converter and an alternating current (AC) input has occurred, comprising:
   providing a plurality of sensing diodes, a power supply, and a node between the power supply and each of the plurality of sensing diodes;
   determining a node voltage representing an electrical voltage present at each node;
   determining whether the node voltage at each node persists for at least a predetermined period of time;
   outputting a phase status signal for each node based on the determined node voltage at each node and a determination of whether the node voltage persists for at least the predetermined period of time;
   detecting a phase-specific failure based on the phase status signals; and
   reducing a load of one or more of the nodes based on the detected phase-specific failure, wherein the phase-specific failure is indicative of a disconnection in a node other than the one or more loads with a reduced load.

11. The method of claim 10, wherein the predetermined period of time is equivalent to at least one full period of a signal from a respective phase of the AC input.

12. The method of claim 11, wherein the predetermined period of time is between 20 ms to 100 ms.

13. The method of claim 10, comprising initiating, via a frequency converter controller configured to receive the status signal, a disconnection warning, a redundancy measure, and/or an equipment protection measure.

14. The method of claim 10, comprising actuating, via a frequency converter controller configured to receive the status signal, a safety switch, the safety switch being configured to discharge a direct current (DC) bus voltage of the frequency converter.

15. The method of claim 10, comprising comparing the each node voltage against a base voltage present at an opposite side of the power supply from a respective node.

* * * * *